(12) United States Patent
Zhang et al.

(10) Patent No.: US 9,755,051 B2
(45) Date of Patent: Sep. 5, 2017

(54) EMBEDDED SHAPE SIGE FOR STRAINED CHANNEL TRANSISTORS

(71) Applicant: STMicroelectronics, Inc., Coppell, TX (US)

(72) Inventors: John H. Zhang, Altamont, NY (US); Pietro Montanini, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/969,911

(22) Filed: Dec. 15, 2015

(65) Prior Publication Data

US 2016/0099339 A1   Apr. 7, 2016

Related U.S. Application Data

(62) Division of application No. 13/931,509, filed on Jun. 28, 2013, now Pat. No. 9,245,955.

(51) Int. Cl.

| | |
|---|---|
| *H01L 29/66* | (2006.01) |
| *H01L 29/165* | (2006.01) |
| *H01L 21/8238* | (2006.01) |
| *H01L 27/092* | (2006.01) |
| *H01L 21/265* | (2006.01) |
| *H01L 29/78* | (2006.01) |
| *H01L 29/10* | (2006.01) |

(52) U.S. Cl.
CPC .. *H01L 29/66636* (2013.01); *H01L 21/26586* (2013.01); *H01L 21/823807* (2013.01); *H01L 21/823814* (2013.01); *H01L 21/823864* (2013.01); *H01L 27/092* (2013.01); *H01L 29/1054* (2013.01); *H01L 29/165* (2013.01); *H01L 29/66568* (2013.01); *H01L 29/66651* (2013.01); *H01L 29/7834* (2013.01); *H01L 29/66628* (2013.01)

(58) Field of Classification Search
CPC ............... H01L 29/7848; H01L 29/165; H01L 29/66636
See application file for complete search history.

(56) References Cited

U.S. PATENT DOCUMENTS

| | | | | |
|---|---|---|---|---|
| 4,908,332 | A | * | 3/1990 | Wu ................... H01L 21/28061 257/E21.2 |
| 5,658,811 | A | | 8/1997 | Kimura et al. |
| 9,034,741 | B2 | | 5/2015 | Adam et al. |

(Continued)

OTHER PUBLICATIONS

Yang, H. S. et al., "Dual Stress Liner for High Performance Sub-45NM Gate Length SOI CMOS Manufacturing," Electron Devices Meeting, 2004, IEDM Technical Digest, IEEE International, Dec. 13-15, 2004 (3 pgs.).

*Primary Examiner* — Tucker J Wright
(74) *Attorney, Agent, or Firm* — Seed IP Law Group LLP (57) ABSTRACT

An integrated circuit die includes a silicon substrate. PMOS and NMOS transistors are formed on the silicon substrate. The carrier mobilities of the PMOS and NMOS transistors are increased by introducing tensile stress into the channel regions of the NMOS transistors and compressive stress into the channel regions of the PMOS transistors. Tensile stress is introduced by including a region of SiGe below the channel region of the NMOS transistors. Compressive stress is introduced by including regions of SiGe in the source and drain regions of the PMOS transistors.

24 Claims, 8 Drawing Sheets

(56) References Cited

U.S. PATENT DOCUMENTS

| | | |
|---|---|---|
| 2005/0263825 A1 | 12/2005 | Frohberg et al. |
| 2007/0138570 A1 | 6/2007 | Chong et al. |
| 2009/0085125 A1* | 4/2009 | Kim ................ H01L 21/823807 257/369 |
| 2009/0134381 A1 | 5/2009 | Shimamune et al. |
| 2011/0042758 A1* | 2/2011 | Kikuchi .............. H01L 29/1054 257/408 |
| 2011/0259936 A1* | 10/2011 | Lichtensteiger ....... B28D 1/221 225/1 |
| 2011/0287600 A1* | 11/2011 | Cheng ............... H01L 21/02639 438/299 |
| 2012/0043624 A1* | 2/2012 | Liang ................ H01L 29/66545 257/410 |
| 2012/0181634 A1 | 7/2012 | Yin et al. |
| 2013/0240956 A1 | 9/2013 | Hou et al. |
| 2014/0077275 A1 | 3/2014 | Adam et al. |

* cited by examiner

EMBEDDED SHAPE SIGE FOR STRAINED CHANNEL TRANSISTORS

RELATED APPLICATION

This patent application is a divisional of U.S. patent application Ser. No. 13/931,509 filed Jun. 28, 2013.

BACKGROUND

Technical Field

The present disclosure relates to a method and structure for forming strained transistors.

Description of the Related Art

Scaling of transistor size has served to improve switching speed (the maximum speed at which a transistor can be switched off or on), conduction properties, and circuit density. However as CMOS technology has reached the 32 nm and 16 nm nodes, scaling has become more difficult and new means for improving device function have been sought.

One means for improving transistor properties is to introduce strain in the channel of the transistor. This has been done by carefully forming strain inducing layers of materials above the channel region of the transistor. The strain inducing layers induce either a tensile or compressive strain on the channel region of the transistor, according to the type of the transistor, and in so doing improve carrier mobility in the channel region. The improved carrier mobility enhances current conduction in the channel region, which in turn allows for lower power dissipation and enhanced transconductance. The enhanced transconductance means that a larger current can be induced in the channel with a smaller gate to source voltage, allowing for lower supply voltages to be used on chip. The lower supply voltages allow for further reduction of power dissipation It is known in the art that a transistor subjected to different types of stress increases the mobility of the charge carriers in the channel region. For example, creating a tensile stress in the channel region increases the mobility of electrons and, depending on the magnitude of the stress, increases in mobility of up to 20% may be obtained. This, in turn, directly translates into an increase in conductivity and faster speed. Similarly, compressive stress in the channel region may increase the mobility of holes, thereby providing enhanced performance of those transistors which conduct based on the mobility of holes.

Consequently, it is has been proposed to introduce a compressive stress into the channel region of N-type transistors and a tensile stress into the channel region of P-type transistors. A number of structures have been proposed in the prior art to induce stress in these respective channel regions.

A common MOS transistor includes source, drain, and channel regions formed in a mono crystalline semiconductor substrate. A gate electrode is positioned over the channel region. Sidewall spacers are formed adjacent the gate electrode.

Strain is induced in the channel region of the transistor by depositing a dielectric layer over the gate electrode, the sidewall spacers, and the source and drain regions. Silicon nitride is commonly used for a strain inducing dielectric layer 56, but other strain inducing layers are also used. The $Si_3N_4$ strain inducing layer may be deposited by means of a low pressure chemical vapor deposition (LPCVD), plasma enhanced chemical vapor deposition (PECVD), or other suitable methods.

A silicon nitride layer 56 can have compressive or tensile strain characteristics depending on the conditions during formation of the silicon nitride. Silicon nitride can be formed by PECVD in a chamber in the presence of silane ($SiH_4$), $N_2$, and ammonia ($NH_3$). By varying the silane flow rate, the ammonia flow rate, the $N_2$ flow rate, the pressure, temperature (both before and after deposition), and the low and high frequency power outputs in the deposition chamber, a silicon nitride layer can be made to have varying levels of compressive or tensile strain.

A structure of this type is described and shown in detail in U.S. Patent Application Publication No. 2005/0263825 to Frohberg et al., (the '825 application) which is incorporated herein by reference.

Another method for increasing carrier mobility in an NMOS device is to implant carbon and phosphorus into the silicon source and drain regions of the transistor. The carbon and phosphorus are implanted into the silicon with an acceleration energy of 15 KeV. If the implantation is performed at room temperature, many residual crystal defects occur in the silicon substrate. Such crystal defects include dislocations, stacking faults, and arrange defects. These defects can be partially avoided if the implantation is performed at very cold temperatures, for example −60°. However, implanting at this low temperature is also very expensive and time-consuming.

BRIEF SUMMARY

One embodiment is of the present disclosure an integrated circuit die including a silicon substrate. A PMOS transistor and an NMOS transistor are formed in the silicon substrate. The channel region of the PMOS transistor is strained in a compressive manner. The channel region of the NMOS transistor is strained in a tensile manner.

The PMOS transistor includes source and drain regions in the silicon substrate. First trenches are isotropically etched in the PMOS source and drain regions. SiGe is grown in the first trenches. Due to the shape of the first trenches, a compressive strain is induced on the silicon PMOS channel region between the SiGe filled first trenches.

The NMOS transistor includes source and drain regions in the silicon substrate. A second trench is etched in the silicon substrate between the NMOS source and drain regions. The second trench is filled with SiGe. A thin silicon NMOS channel region is epitaxially grown on the SiGe in the second trench. The SiGe in the second trench induces a tensile strain on the silicon NMOS channel region.

One embodiment is a method for forming a compressively strained PMOS transistor and a NMOS transistor under tensile strain. The method includes implanting dopants into a silicon substrate to form source and drain regions for the PMOS and NMOS transistors. The method further includes isotropically etching first trenches in the source and drain regions of the PMOS transistor, anisotropically etching a second trench in the silicon between the source and drain regions of the NMOS transistor, and simultaneously growing SiGe in the first and second trenches. An epitaxial silicon layer is then grown on the SiGe of the second trench. The epitaxial silicon layer is the channel region of the NMOS transistor and subject to tensile strain from the SiGe of the second trench. The channel region of the PMOS transistor is in the silicon substrate between the first trenches. The channel region of the PMOS transistor is subject to compressive strain from the SiGe in the first trenches.

DETAILED DESCRIPTION

Figure 1:
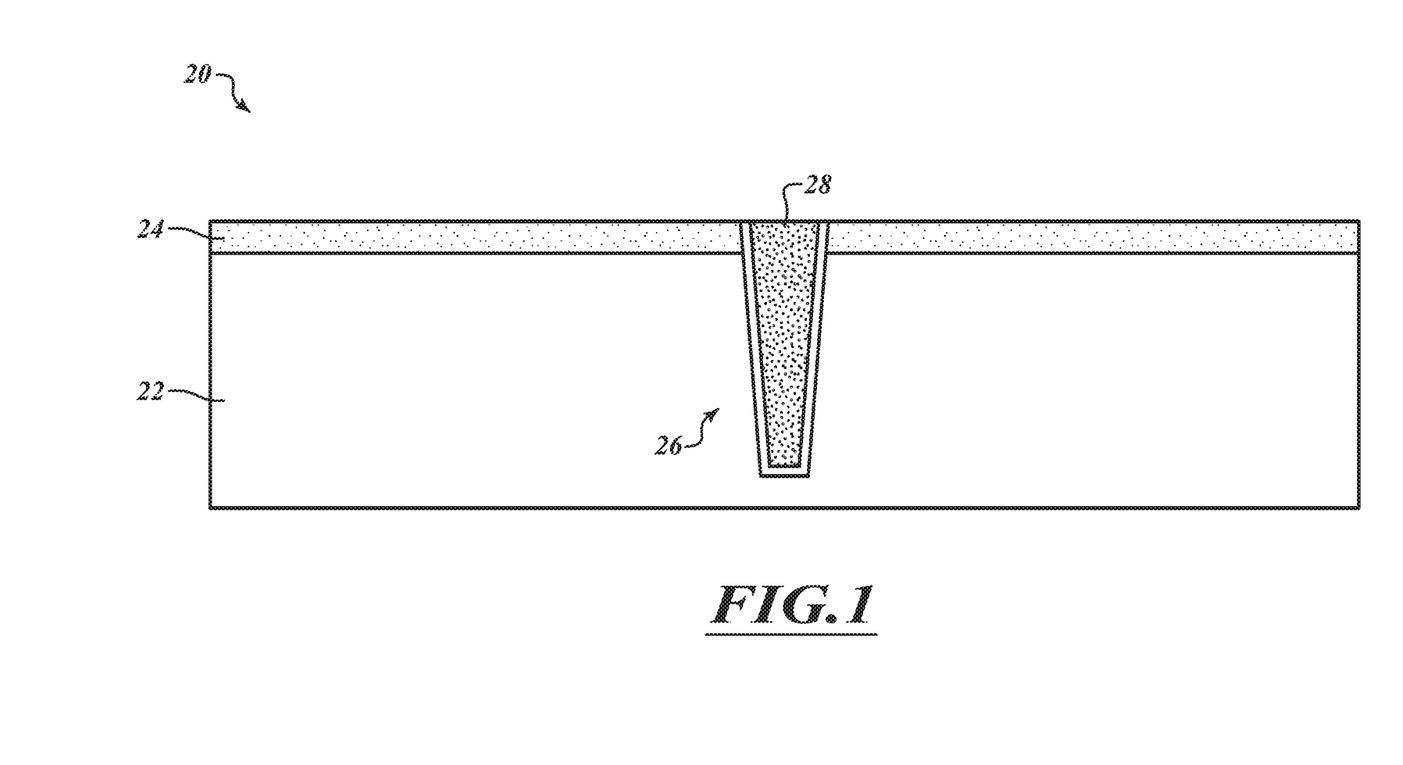
FIG. 1 is a cross-section of an integrated circuit die in which a shallow trench isolation has been formed in a silicon substrate according to one embodiment.

FIG. 1 is a cross-section of an integrated circuit die 20 at an early stage of processing. The integrated circuit die 20 includes a semiconductor substrate 22 and a dielectric layer 24 overlying the semiconductor substrate 22. Usually a thin pad oxide layer of $SiO_2$ is grown on the substrate 22 before dielectric layer 24 is formed as is known in the art. Shallow trench isolation region 26 is formed in the semiconductor substrate 22. The shallow trench isolation region 26 is filled with dielectric material 28.

In one embodiment, the semiconductor substrate 22 is a monocrystalline silicon substrate. The monocrystalline silicon substrate 22 is a 001 silicon lattice having the 110 axis going from left to right.

The dielectric layer 24 is silicon nitride about 50 nm thick. The shallow trench isolation region 26 has been etched through the silicon nitride dielectric layer 24 and the silicon substrate 22. The shallow trench isolation region 26 is about 200-500 nm deep. The dielectric material 28 is a silicon oxide, such as $SiO_2$.

Figure 2:
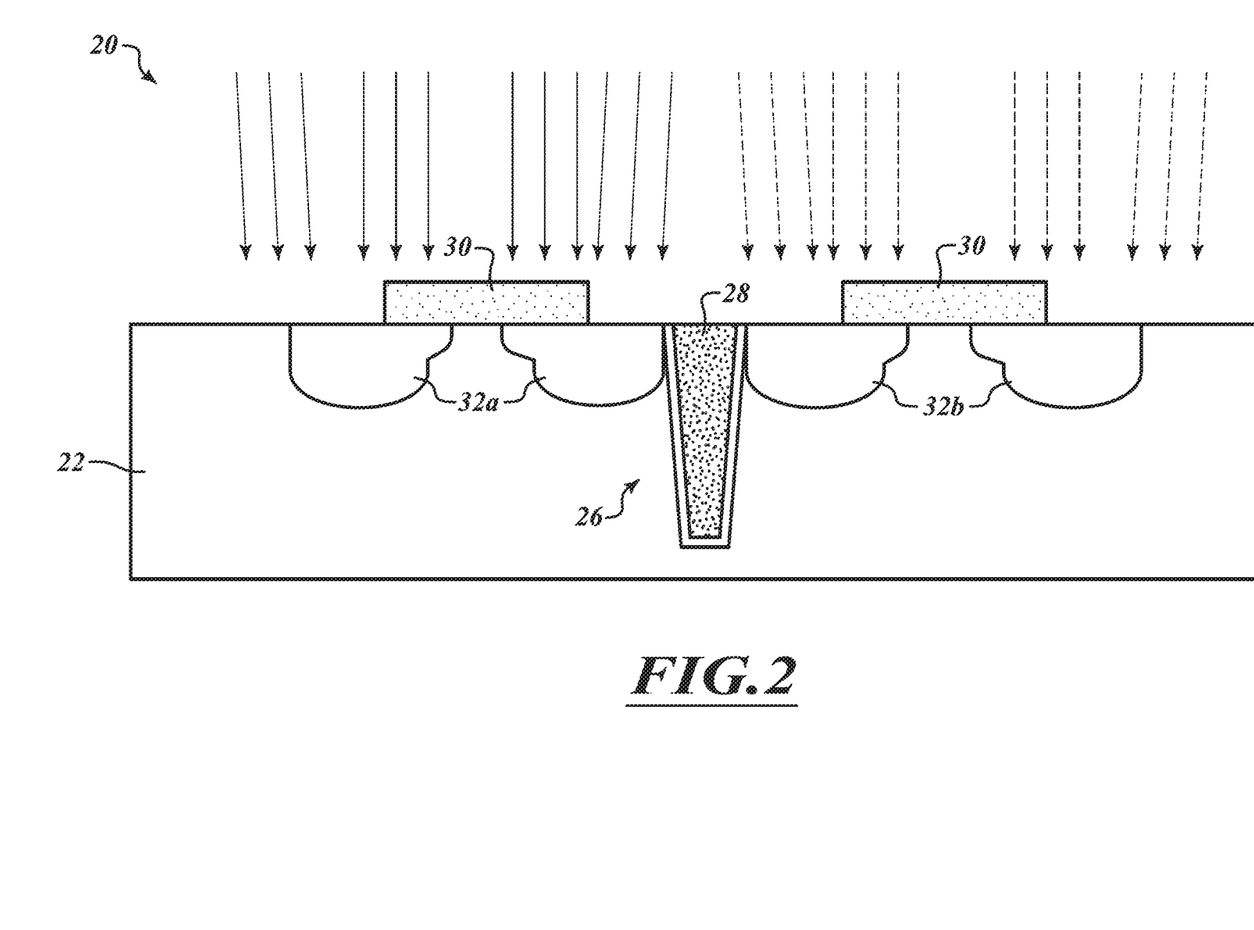
FIG. 2 is a cross-section of the integrated circuit die after source and drain regions have been formed for a PMOS and an NMOS transistor according to one embodiment.

In FIG. 2, the dielectric layer 24 has been removed. The dielectric layer 24 can be removed by etching, without a mask, using an etchant that selectively etches the dielectric layer 24 with respect to the silicon substrate 22. A hard mask 30 is formed on the silicon substrate 22. The hard mask 30 is a dielectric layer that is selectively etchable with respect to the silicon substrate 22. In one example, the hard mask 30 is silicon nitride. The hard mask 30 can be patterned using conventional photolithography techniques. For example, the hard mask 30 can be formed by depositing silicon nitride on the surface of the silicon substrate 22. Photoresist can be deposited in liquid form by a spin on process. In a spin on process, a certain amount of liquid photoresist is placed on the integrated circuit die 20 and the whole integrated circuit die 20 is rotated rapidly causing the liquid photoresist to spread outward to cover the entire integrated circuit die 20. The liquid photoresist is then cured and hardened. A mask is then placed over the integrated circuit die 20 having a pattern corresponding to the hard mask 30 of FIG. 2. The mask is then irradiated with ultraviolet light which is allowed to pass through the mask to irradiate the photoresist according to the pattern of the mask. The irradiated portions of the photoresist undergo a chemical change causing the irradiated portions of the photoresist to be selectively stripped away. The integrated circuit die 20 is then subjected to an acid etch which etches the portions of the dielectric layer left exposed by the removal of the portions of the photoresist, leaving only the hard mask 30 as shown in FIG. 2.

NMOS source and drain regions 32a and PMOS source and drain regions 32b are then formed in the silicon substrate 22 by implanting dopant species into the silicon substrate 22. The NMOS source and drain regions 32a are formed by implanting phosphorous ions into the silicon substrate 22. The phosphorous ions are implanted in two steps. In a first step, phosphorous ions are accelerated toward the silicon substrate 22 at normal incidence as indicated by the straight solid arrows on the left side of FIG. 2. This forms relatively highly doped portions of the NMOS source and drain regions 32a not directly below the hard mask 30 on the left of the integrated circuit die 20. Subsequently, in a second step phosphorous ions are again accelerated toward the silicon substrate 22, but in a direction with a slight angle with respect to normal as indicated by the slanted solid arrows on the left side of the integrated circuit die 20 of FIG. 2. This causes lightly doped portions of the source and drain regions 32a to be formed below the hard mask 30 on the left side of the integrated circuit die 20 of FIG. 2. The lightly doped source and drain regions have a smaller concentration of dopant ions than do the portions of the source and drain regions 32a outside of the hard mask 30 on the left side of the integrated circuit die 20 of FIG. 2.

PMOS source and drain regions 32b are formed in the silicon substrate 22 on the right side of the integrated circuit die 20 of FIG. 2. The PMOS source and drain regions 32b are formed by implanting boron ions into the silicon substrate 22. The boron ions are implanted in two steps. In a first step, boron ions are accelerated toward the silicon substrate 22 at normal incidence as indicated by the straight arrows on the right side of FIG. 2. The boron atoms are implanted into the silicon substrate 22 forming relatively highly doped portions of the PMOS source and drain regions 32b not directly below the hard mask 30 on the right of the integrated circuit die 20. Subsequently, in a second step, boron ions are again accelerated toward the silicon substrate 22, but in a direction having a slight angle with respect to normal as indicated by the slanted dashed arrows on the right side of the integrated circuit die 20 of FIG. 2. This causes lightly doped portions of the source and drain regions 32b to be formed below the hard mask 30 on the right side of the integrated circuit die 20 of FIG. 2. The lightly doped source and drain regions have a smaller concentration of dopant ions than do the portions of the source and drain regions 32b outside of the hard mask 30 on the left side of the integrated circuit die 20 of FIG. 2.

While portions of the hard mask 30 on the left and right sides of FIG. 2 have been described as being formed at the same time in a single photolithography process, those of skill the art will understand that the portions of the hard mask 30 are formed in separate processes and will have a slightly different appearance than shown with respect to FIG. 2. For example, a first portion of the hard mask 30 will be formed for the implantation of the NMOS source and drain regions 32a. The first hard mask will include the portion on the left side of the integrated circuit die 20 of FIG. 2, but will also cover the entire right side of the integrated circuit die 20 where the PMOS transistor will be formed. After the NMOS source and drain regions 32a have been formed, the hard mask 30 used for forming the NMOS source and drain regions 32a will be stripped away. A separate photolithography process will then be performed to form the hard mask 30 shown on the right side of the integrated circuit die 20 of FIG. 2. The PMOS source and drain implantations will then be performed in the presence of the second hard mask which will also cover the left side of the integrated circuit die 20 of FIG. 2. Those of skill in the art will understand that many processes can be used to form the NMOS and PMOS source and drain regions 32a, 32b.

Figure 3:
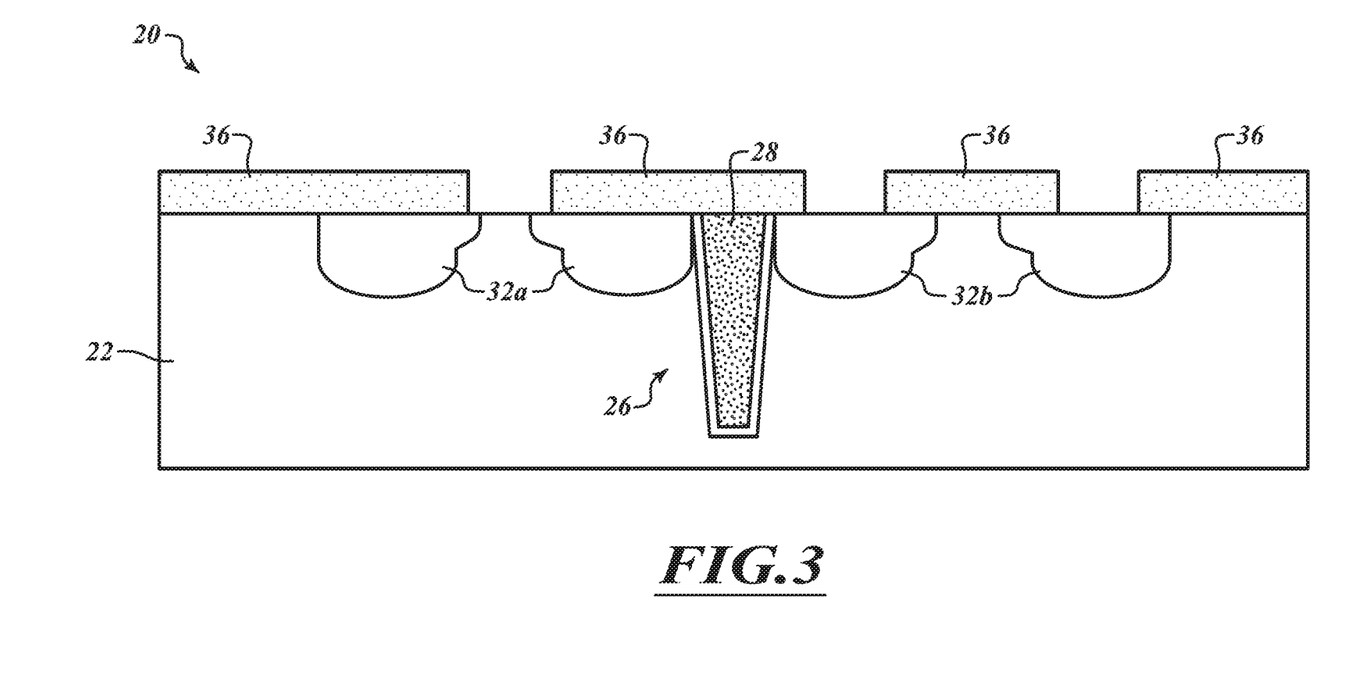
FIG. 3 is a cross-section of the integrated circuit die after a hard mask has been formed for etching trenches in the silicon substrate according to one embodiment.

In FIG. 3, portions of a new hard mask 36 have been formed on the silicon substrate 22. The hard mask 36 is hardened photoresist which has been photo lithographically patterned as described previously in relation to FIG. 2. The portions of the hard mask 36 formed on the right side of the integrated circuit die 20 of FIG. 3 are not simultaneously present with the portions of the hard mask 36 shown on the left side of the integrated circuit die 20 of FIG. 3. As will be described below in relation to FIG. 4, two hard masks will be formed in separate processes to etch separate trenches at separate times on the left and right sides of the integrated circuit die 20.

Figure 4:
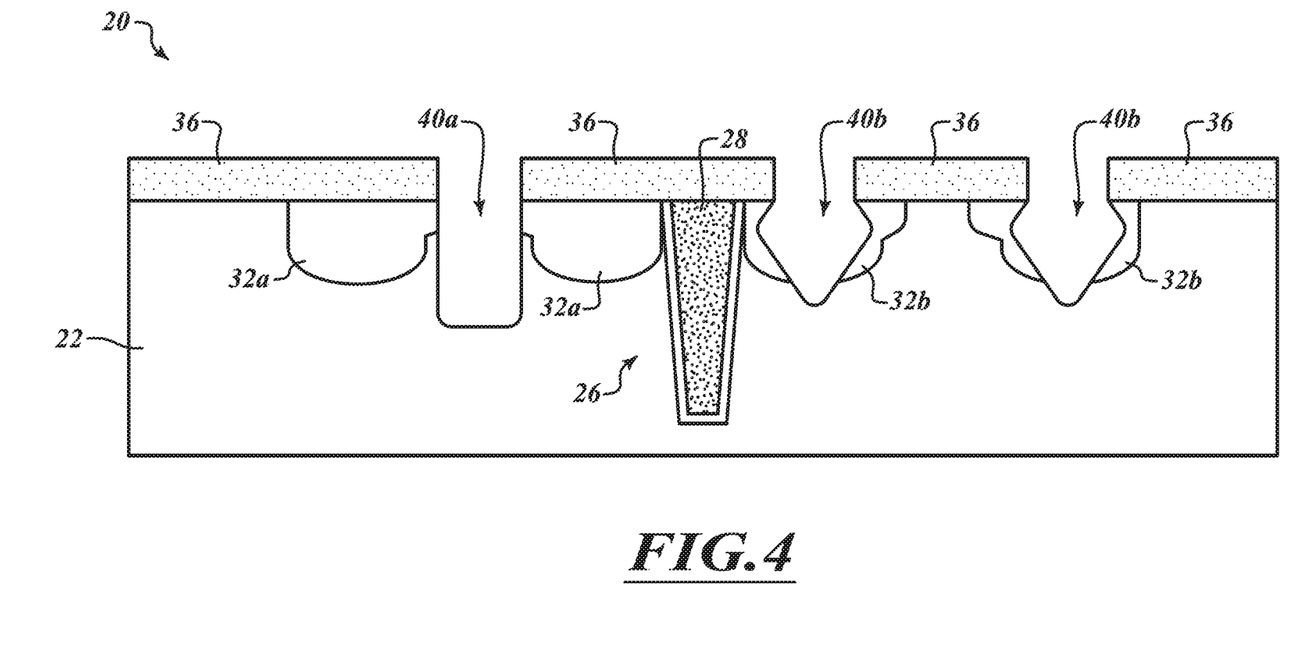
FIG. 4 is a cross-section of the integrated circuit die after trenches have been etched in the silicon substrate according to one embodiment.

In FIG. 4, a first trench 40a has been formed on the left side of the integrated circuit die 20 in the silicon substrate 22 between the NMOS source and drain regions 32a. The first trench 40a is formed by etching the portion of the silicon substrate 22 left exposed by the hard mask 36 as pictured on the left side of the integrated circuit die 20 of FIG. 4. In one example, the first trench 40a is anisotropically etched in the silicon substrate by a reactive ion etching (RIE) process. In the reactive ion etching process, chemically reactive plasma is used to remove material from the silicon substrate 22. The plasma is generated in a vacuum by an intense electromagnetic field. High-energy ions are directed towards the silicon substrate 22, reacting with and etching it. In one example, the plasma is sulfur hexafluoride. Because the plasma comes toward the silicon substrate 22 at normal incidence, RIE produces a very anisotropic etch profile.

The width of the first trench 40a corresponds to the width of the channel region of the NMOS transistor which will be described in more detail below. The width of the first trench 40a therefore corresponds to the technology node at which the integrated circuit die 20 is being processed. For example, if the integrated circuit die 20 is being processed at the 32 nm technology node, then the width of the first trench 40a will be about 32 nm, corresponding to the channel length of the NMOS transistor. The width of the first trench 40a will be different depending on the technology node.

After the first trench 40a is formed, second trenches 40b are formed in the PMOS source and drain regions 32b. The second trenches 40b are formed by isotropically etching the portions of the silicon substrate 22 exposed by the hard mask 36 on the right side of the integrated circuit die 20 of FIG. 4. The silicon substrate 22 can be isotropically etched using a liquid etchant that etches the silicon approximately equally in all directions. In one example, the second trenches 40b are formed by etching the silicon substrate 22 with NH$_4$OH. The cross-sections of the second trenches 40b have a somewhat diamond shape which can be desirable for compressively straining the silicon substrate 22, as will be described in more detail below.

The width of the second trenches 40b corresponds to the width of the channel region of the PMOS transistor which will be described in more detail below. The width of the second trenches 40b therefore corresponds to the technology node at which the integrated circuit die 20 is being processed. For example, if the integrated circuit die 20 is being processed at the 32 nm technology node, then the width of the second trenches 40b will be about 32 nm, corresponding to the channel length of the PMOS transistor. The width of the second trenches will be different depending on the technology node being implemented.

Figure 5:
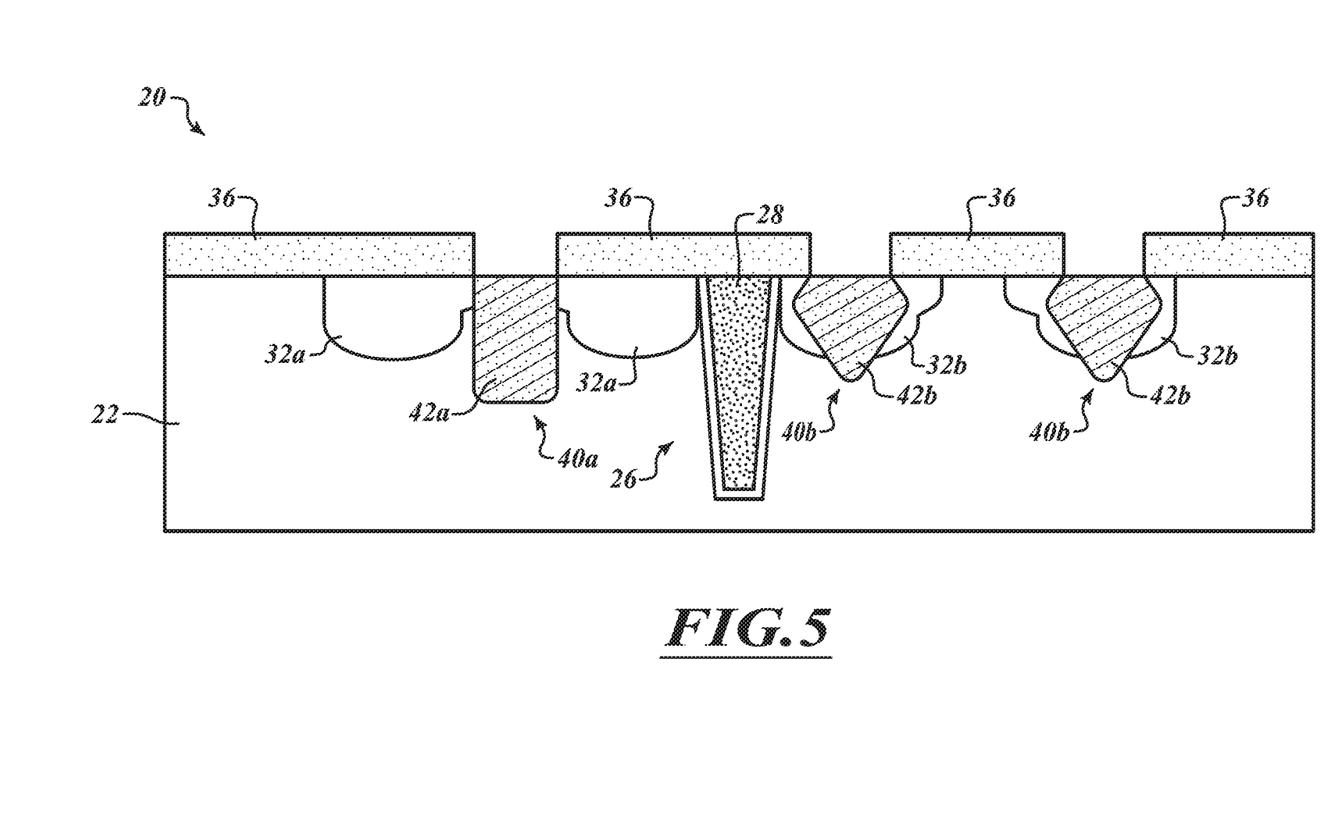
FIG. 5 is a cross-section of the integrated circuit die after the trenches have been filled with SiGe according to one embodiment.

In FIG. 5 a first SiGe region 42a and a second SiGe regions 42b are respectively grown in the trenches 40a and 40b. The SiGe regions 42a, and 42b fill the trenches 40a and 40b. The SiGe regions 42a and 42b are monocrystalline semiconductor regions.

Because the silicon and SiGe have crystal lattice spacings that are similar in size, the SiGe regions 42a and 42b can be formed by an epitaxial growth process. In the epitaxial growth process Si and Ge gases are introduced into the trenches 40a and 40b in particular proportions. When SiGe is formed, the percentage of each of the two elements can vary based on the formula of $Si_{1-x}Ge_x$ in which x is the percentage of Ge. A lower value of x results in a lattice spacing of the SiGe having a relatively small mismatch with respect to the lattice spacing of Si. A higher value of x results in a lattice spacing of the SiGe that is larger mismatch with respect to the lattice spacing of the Si. The mismatch in lattice spacings between SiGe and Si causes strain in the Si. Because the lattice spacing of SiGe is larger than that of Si, a flat silicon layer grown on a flat SiGe layer will undergo tensile strain, which is beneficial to the carrier mobility in NMOS transistors. Applicants have found that particularly shaped regions of SiGe can also induce compressive strain in silicon, as will be described in more detail below. The shape is therefore selected for the trenches 40a and 40b to achieve a desired strain on the channel, whether compressive or tensile.

Figure 6:
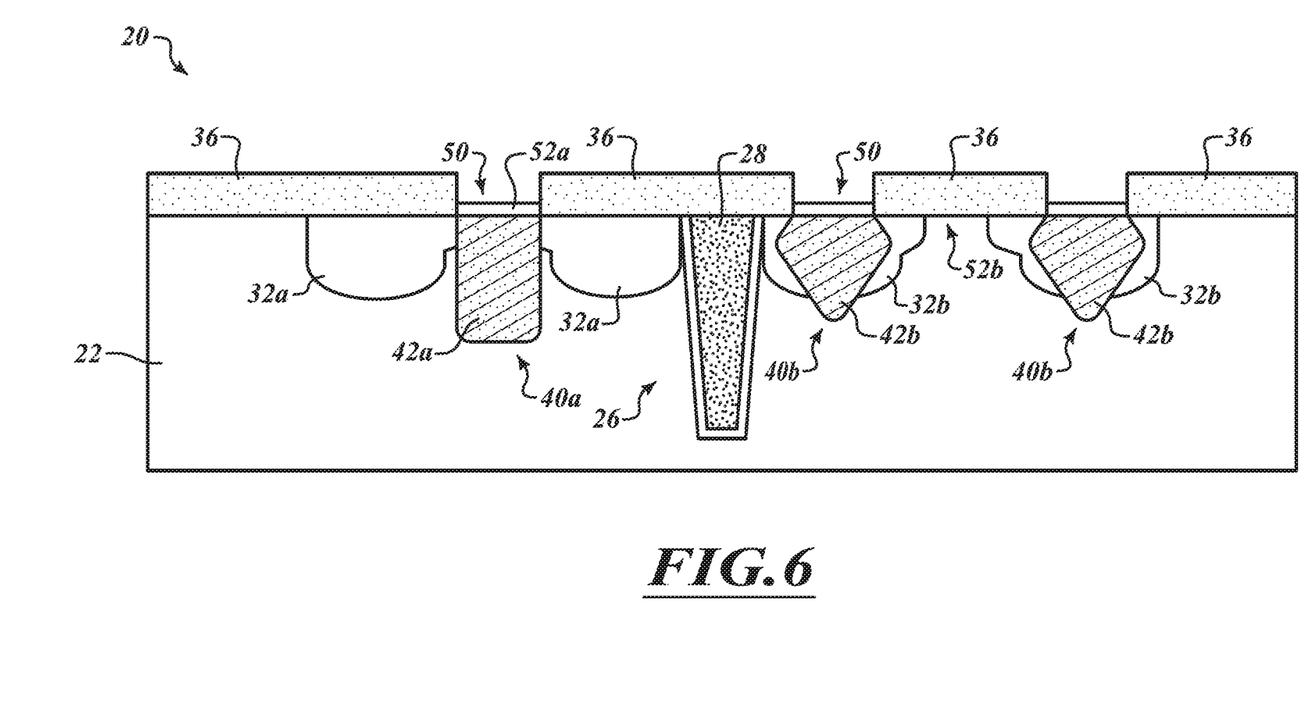
FIG. 6 is a cross-section of the integrated circuit die after an epitaxial silicon layer has been grown on the SiGe according to one embodiment.

In FIG. 6, a thin silicon layer 50 is formed on the SiGe regions 42a, 42b. The thin silicon layer 50 is formed by epitaxial growth from the SiGe regions 42a, 42b and is about 2-20 nm thick. As set forth above, crystalline silicon is lattice-mismatched with respect to crystalline SiGe due to the difference in their lattice spacings. The mismatch is sufficiently small such that the silicon layer 50 can be grown as a single crystal aligned with the single crystal structures of the SiGe regions 42a, 42b.

The portion of the silicon layer 50 above the SiGe region 42a is the channel region 52a of an NMOS transistor, as will be shown in further detail below. The thin silicon layer 50 that is epitaxially grown on the SiGe region 42a will be under tensile strain because the lattice of the thin silicon layer 50 is forced to align to the lattice of the relaxed crystalline SiGe region 42a. The channel region 52a of the NMOS transistor will therefore be under tensile strain, thereby improving the electron mobility in the channel region 52a.

The portion of the silicon substrate 22 between the PMOS source and drain regions 32b is the channel region 52b. Due to the selected shape of SiGe regions 42b on either side of the channel region 52b, the channel region 52b is under compressive strain. Under typical circumstances, monocrystalline silicon adjacent to monocrystalline SiGe will be under tensile strain. However, applicants have determined that when two SiGe regions have a somewhat diamond shape the silicon region between the points of the diamonds will be under compressive strain. Therefore, the channel region 52b of the PMOS transistor is under compressive strain. This causes a beneficial increase in the mobility of holes in the channel region 52b.

Figure 7:
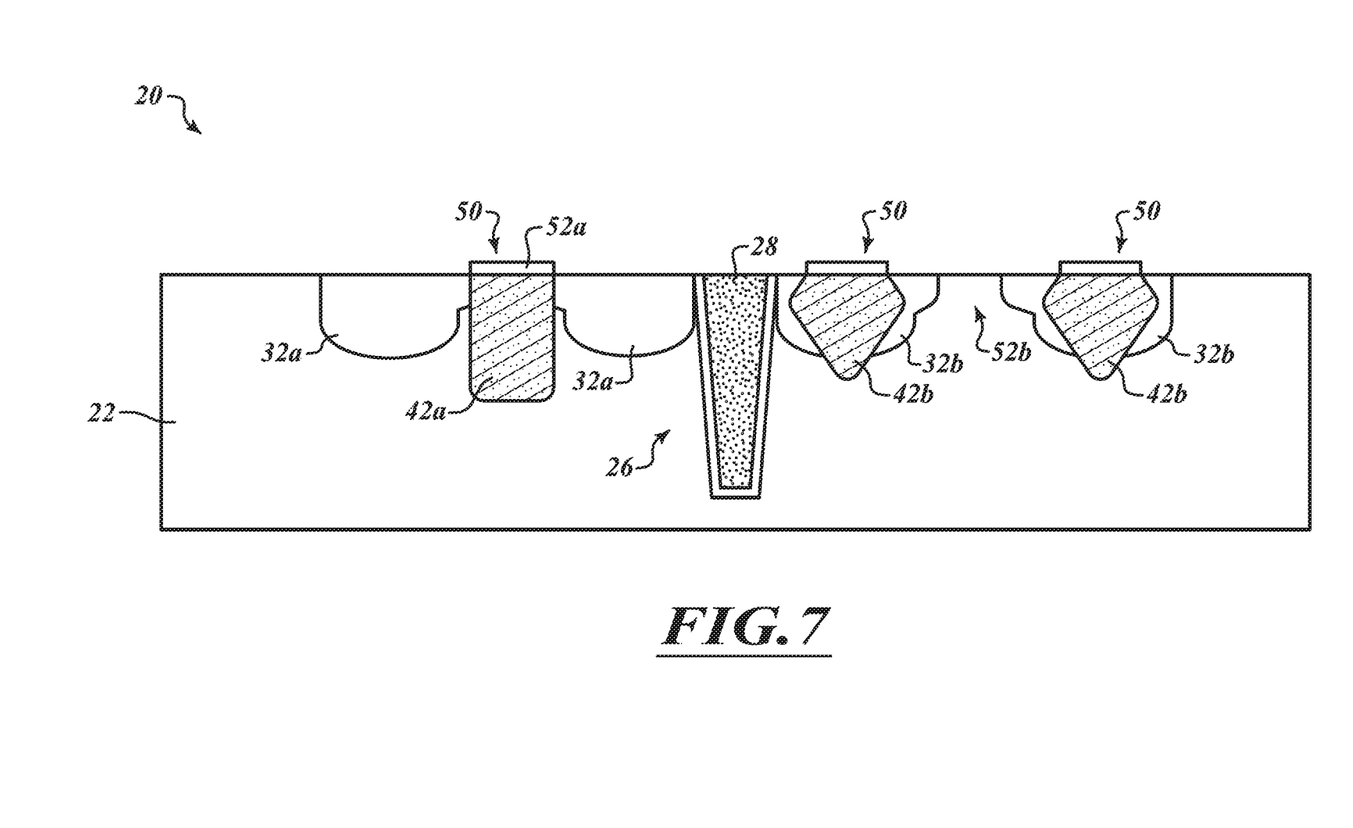
FIG. 7 is a cross-section of the integrated circuit die after the hard mask has been stripped away according to one embodiment.

In FIG. 7, the hard mask 36 has been removed.

Figure 8:
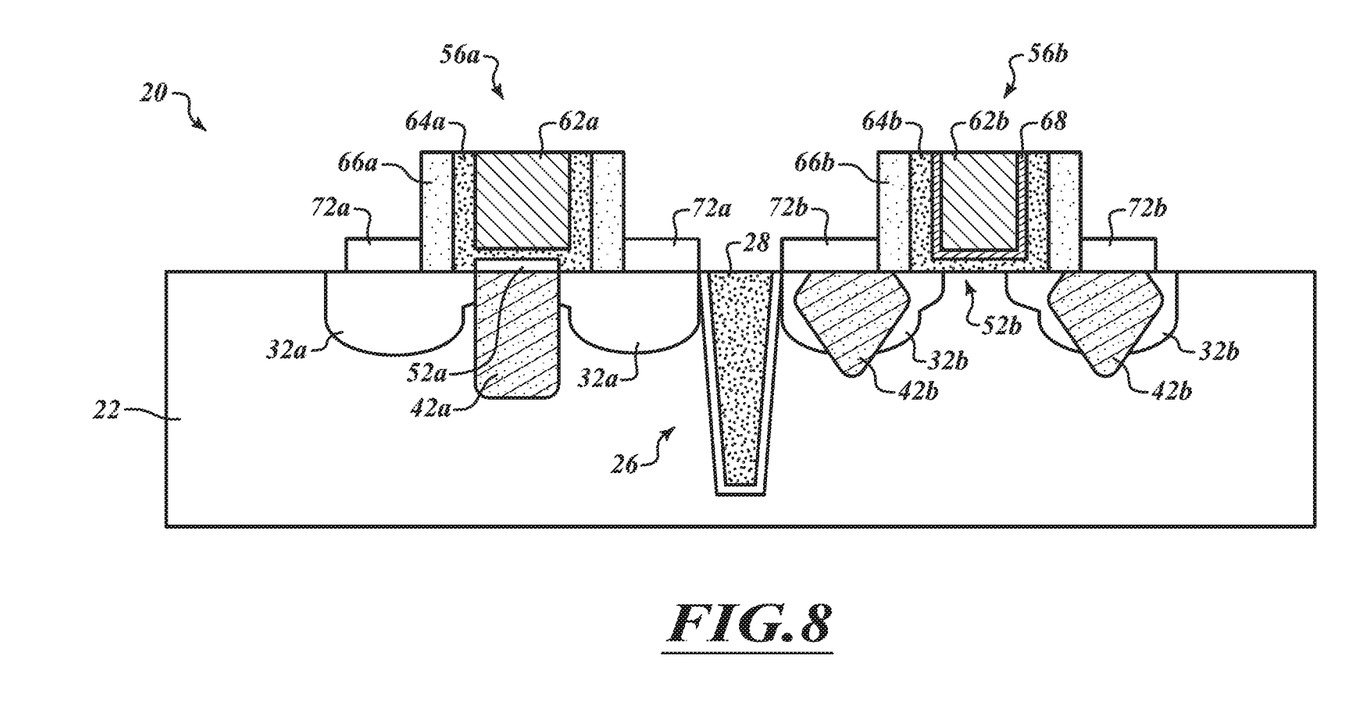
FIG. 8 is a cross-section of the integrated circuit die after gate structures and elevated source and drain regions have been formed for the PMOS and NMOS transistor according to one embodiment.

In FIG. 8, an NMOS transistor 56a is fully formed. The NMOS transistor 56a includes a gate electrode 62a. A gate dielectric 64a separates the gate electrode 62a from the channel region 52a. Sidewall spacers 66a are on the sides of the gate dielectric 64a. Raised source and drain regions 72a are positioned on the source and drain regions 32a.

In one embodiment, the gate electrode 62a is a metal gate electrode, for example, tungsten. The gate dielectric 64a is a high K gate dielectric. A high K gate dielectric is one that has a dielectric constant K that is relatively high compared to other gate dielectrics such as silicon oxide gate dielectrics. One embodiment the high K gate dielectric 64a includes hafnium. Sidewall spacers 66a are, for example, silicon nitride. The sidewall spacer 66a can also include multiple layers of both silicon oxide and silicon nitride. Raised source and drain regions 72a are formed by epitaxial growth from the source and drain regions 32a. The epitaxial growth from the silicon substrate 22 produces raised source and drain regions 72a of a single crystal with the silicon substrate 22. Therefore, though raised source and drain regions 72a are shown as separate layers, in practice they are merely an extension of the source and drain regions 32a of the silicon substrate 22.

The NMOS transistor 56a functions in a similar manner to conventional NMOS transistors. By applying a voltage between the source and drain regions 32a, and by applying a voltage to the gate electrode 62a, a current flows through the channel region 52a. Because the channel region 52a has been formed on SiGe region 42a, the channel region 52a is under tensile strain. This increases the mobility of the electrons in the channel region 52a. This means that a higher drain current will flow through the channel region 52a when given voltages are applied to the source and drain regions 32a and the gate electrode 62a.

In FIG. 8, the PMOS transistor 56b is also fully formed. The PMOS transistor 56b includes a gate electrode 62b. A gate dielectric 64b separates the gate electrode 62b from the channel region 52b. A thin metal layer 68 separates the gate electrode 62b from the gate dielectric 64b. Sidewall spacers 66b are on the sides of the gate dielectric 64b. Raised source and drain regions 72b are positioned on the source and drain regions 32b.

In one embodiment, the gate electrode 62b is a metal gate electrode, for example, tungsten. The gate dielectric is a high K gate dielectric. A high K gate dielectric is one that has a dielectric constant K that is relatively high compared to other gate dielectrics such as silicon oxide gate dielectrics. In one embodiment, the high K gate dielectric 64b includes hafnium. The thin metal layer 68 is, for example, TiN. The thin metal layer 68 helps reduce the work function between the gate electrode 62b and the silicon substrate 22. Sidewall spacers 66b are, for example, silicon nitride. The sidewall spacer 66b can also include multiple layers of both silicon oxide and silicon nitride. Raised source and drain regions 72b are formed by epitaxial growth from the source and drain regions 32b. The epitaxial growth from the silicon substrate 22 produces raised source and drain regions 72b formed of a single crystal with the silicon substrate 22. Therefore, though raised source and drain regions 72b are shown as separate layers, in practice they are merely an extension from the source and drain regions 32b of the silicon substrate 22.

The PMOS transistor 56b functions in a similar manner to conventional PMOS transistors. By applying a voltage between the source and drain regions 32a, and by applying a voltage to the gate electrode 62b, as current flows through the channel region 52b. Because the SiGe regions 42b have been formed in the source and drain regions 32b, the channel region 52b is under compressive strain. This increases the mobility of the holes in the channel region 52b. This means that a higher drain current will flow through the channel region 52b when given voltages are applied to the source and drain regions 32b and the gate electrode 62b.

Although FIGS. 1-8 have described the formation of transistors 56a and 56b in terms of specific materials, processes, and dimensions, those of skill the art will understand that many other materials can be substituted for those described. For example, the semiconductor substrate 22 can be of a material other than silicon. The SiGe regions 42a, 42b can be filled with a material other than SiGe. Many other materials and processes can be used than those described with particularity herein. All such other materials, processes, and dimensions fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a source region by implanting dopants into a substrate;
    forming a drain region by implanting dopants into the substrate, the source and drain regions separated by a channel region of the substrate;
    forming in the source region a first trench in the substrate, the first trench having angled sides extending below a lowermost boundary of the source region and converging toward a tip in the substrate, an outermost boundary of the angled sides of the first trench being above the lowermost boundary of the source region;
    forming in the drain region a second trench in the substrate, the second trench having angled sides extending below a lowermost boundary of the drain region and converging toward a tip in the substrate, an outermost boundary of the angled sides of the second trench being above the lowermost boundary of the drain region;
    inducing strain on the channel region by filling the first and second trenches with a strain inducing material; and
    forming a gate structure over the channel region.

2. The method of claim 1 wherein forming the gate structure further includes
    forming a high-k gate dielectric;
    forming a metal layer in contact with the high-k gate dielectric;
    forming a metal gate electrode in contact with the metal layer; and
    forming sidewall spacers.

3. The method of claim 2 wherein forming the sidewall spacers includes forming multiple layers of silicon dioxide and silicon nitride.

4. The method of claim 1, further comprising forming an isolation region in the substrate and adjacent to the source and drain regions.

5. The method of claim 1 wherein forming the first and second trenches according to a selected angle of the angled sides determines an amount of strain in the channel region.

6. A method, comprising:
implanting dopants into a silicon substrate to a first selected depth to form an n-type source region in the silicon substrate;
implanting dopants into the silicon substrate to a second selected depth to form an n-type drain region in the silicon substrate;
forming in the silicon substrate, between the n-type source and drain regions, a trench having substantially straight sides and extending downward into the silicon substrate to a depth below the first selected depth and below the second selected depth;
filling the trench with SiGe; and
forming a metal gate structure directly over the trench.

7. The method of claim 6, further comprising forming a silicon channel region overlying the SiGe, the SiGe inducing tensile strain on the silicon channel region.

8. The method of claim 6, further comprising forming raised n-type source and drain regions over the n-type source and drain regions in the silicon substrate.

9. The method of claim 8 wherein forming the raised n-type source and drain regions is accomplished by epitaxial growth from the silicon substrate.

10. The method of claim 6 wherein forming the metal gate structure further includes:
forming a high-k gate dielectric;
forming a metal gate electrode in contact with the gate dielectric; and
forming sidewall spacers.

11. A method, comprising:
forming in a substrate a compressively-strained PMOS transistor having a gate, a p-type source, and a p-type drain, the p-type source and drain including a pair of SiGe regions embedded fully below a top surface of the substrate and having angled sides, each one of the pair of SiGe regions extending below a lowermost boundary of the p-type source and drain regions and converging toward a tip in the substrate;
forming in the substrate a tensilely strained NMOS transistor having a gate, an n-type source, an n-type drain, and an n-type silicon channel, the gate of the PMOS transistor having an additional layer that is not included in the gate of the NMOS transistor, the n-type source and drain spaced apart by a single SiGe region embedded fully below the top surface, the single SiGe region having substantially straight sides oriented transverse to the top surface, the n-type silicon channel formed on the single SiGe region; and
forming between the compressively-strained PMOS transistor and the tensilely strained NMOS transistor an isolation region filled with an insulating material.

12. The method of claim 11, wherein the n-type silicon channel is formed by epitaxial growth from the single SiGe region, the n-type silicon channel having an NMOS channel length.

13. The method of claim 12 wherein a width of the single SiGe region corresponds to the NMOS channel length.

14. The method of claim 11, further comprising extending the source and drain regions of both the PMOS and NMOS transistors to form raised source and drain regions by an epitaxial growth process.

15. The method of claim 11 wherein a width of the PMOS SiGe regions corresponds to a PMOS channel length defined by a separation distance between the PMOS source and drain regions.

16. The method of claim 11 wherein forming the pair of SiGe regions having angled sides is accomplished by forming a pair of trenches using an isotropic etching process and then filling the trenches with epitaxial SiGe.

17. The method of claim 16 wherein the isotropic etching process is a wet chemical etching process.

18. The method of claim 11 wherein forming the single SiGe region having substantially straight sides is accomplished by forming a single trench using an anisotropic etching process and then filling the trench with epitaxial SiGe.

19. The method of claim 18 wherein the pair of trenches is formed after the single trench.

20. A method, comprising:
forming a first source region, a second source region, a first drain region, and a second drain re ion in a substrate;
forming a first trench and a second trench in the first source region and the first drain region, respectively, the first trench and the second trench each having a non-rectangular shape;
forming a third trench in the substrate and between the second source region and the second drain region, the third trench having a rectangular shape:
filling the first trench, the second trench, and the third trench with a stress inducing material; and
forming, subsequent to filling the first trench and the second trench, a first gate structure on the substrate between the first trench and the second trench; and
forming a second gate structure directly over the third trench.

21. The method of claim 20 wherein the first gate structure is formed subsequent to filling the third trench.

22. The method of claim 20, further comprising forming a channel region on the substrate directly over the third trench.

23. The method of claim 20 wherein the first source region and the first drain region have a first conductivity type, and the second source region and the second drain region have a second conductivity type different from the first conductivity type.

24. The method of claim 20 wherein forming the first gate structure includes forming a first dielectric layer, forming a metal layer on the first dielectric layer, and forming a first electrode on the metal layer, and forming the second gate structure includes forming a second dielectric layer and forming a second electrode on the second dielectric layer.

* * * * *

UNITED STATES PATENT AND TRADEMARK OFFICE
CERTIFICATE OF CORRECTION

PATENT NO. : 9,755,051 B2
APPLICATION NO. : 14/969911
DATED : September 5, 2017
INVENTOR(S) : John H. Zhang et al.

Page 1 of 1

It is certified that error appears in the above-identified patent and that said Letters Patent is hereby corrected as shown below:

In the Claims

Column 10, Lines 27-28:
"first drain region, and a second drain re ion in a substrate;" should read, --first drain region, and a second drain region in a substrate;--.

Signed and Sealed this
Nineteenth Day of February, 2019

Andrei Iancu
*Director of the United States Patent and Trademark Office*